(12) United States Patent
Tang et al.

(10) Patent No.: US 8,766,680 B2
(45) Date of Patent: Jul. 1, 2014

(54) VOLTAGE TRANSLATION CIRCUIT

(71) Applicants: Xinghai Tang, Cedar Park, TX (US);
Gayathri A. Bhagavatheeswaran,
Austin, TX (US); Hector Sanchez,
Cedar Park, TX (US)

(72) Inventors: Xinghai Tang, Cedar Park, TX (US);
Gayathri A. Bhagavatheeswaran,
Austin, TX (US); Hector Sanchez,
Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/627,327

(22) Filed: Sep. 26, 2012

(65) Prior Publication Data
US 2014/0084975 A1 Mar. 27, 2014

(51) Int. Cl.
*H03L 7/06* (2006.01)
*H03L 5/00* (2006.01)

(52) U.S. Cl.
USPC ............. 327/152; 327/333; 326/62; 326/81; 331/17

(58) Field of Classification Search
USPC ........ 327/147–161, 306, 333, 80–81; 331/17, 331/34; 326/62–63
See application file for complete search history.

(56) References Cited

U.S. PATENT DOCUMENTS

| | | | |
|---|---|---|---|
| 5,471,429 A | 11/1995 | Lee et al. | |
| 5,710,527 A | 1/1998 | Yaguchi et al. | |
| 5,721,504 A | 2/1998 | Sato | |
| 5,732,032 A | 3/1998 | Park et al. | |
| 6,765,430 B2 | 7/2004 | Ando | |
| 6,885,234 B2 | 4/2005 | Ando | |
| 6,940,337 B2 | 9/2005 | Viswanathan et al. | |
| 6,985,040 B2 * | 1/2006 | Kim | 331/16 |
| 7,123,236 B2 | 10/2006 | Ker et al. | |
| 7,498,886 B2 | 3/2009 | Lin | |
| 7,724,078 B2 | 5/2010 | Kurd et al. | |
| 7,733,192 B2 * | 6/2010 | Yamamoto | 331/177 R |
| 7,880,550 B2 | 2/2011 | Mai et al. | |
| 7,965,145 B2 * | 6/2011 | Kim et al. | 331/57 |
| 8,542,051 B2 * | 9/2013 | Ogawa | 327/333 |
| 2003/0076180 A1 | 4/2003 | Murakami | |
| 2005/0195045 A1 | 9/2005 | Zhang et al. | |
| 2010/0013563 A1 | 1/2010 | Kim et al. | |
| 2010/0271117 A1 | 10/2010 | Chou | |
| 2010/0315171 A1 | 12/2010 | Mai et al. | |
| 2011/0209021 A1 | 8/2011 | Sorensen et al. | |

OTHER PUBLICATIONS

U.S. Appl. No. 12/483,503 Notice of Allowance mailed Oct. 27, 2010.
U.S. Appl. No. 13/627,333, filed Sep. 26, 2012.
U.S. Appl. No. 13/629,643, filed Jun. 28, 2012.

* cited by examiner

*Primary Examiner* — Dinh T. Le
(74) *Attorney, Agent, or Firm* — David G. Dolezal; Joanna G. Chiu

(57) ABSTRACT

A voltage translation circuit (116) provides an output analog voltage signal that has a translated voltage of the voltage of an input analog voltage signal over a range of values of the input analog voltage signal. The voltage translation circuit includes an input stage (202) having a circuit node and an input transistor (210) coupled between the circuit node and a power supply terminal, wherein a gate of the input transistor is coupled to receive the input analog voltage signal; a current path circuit (204) in parallel with the input transistor, wherein the current path includes a first transistor coupled between the circuit node and the power supply terminal; and a circuit coupled to provide a variable body bias voltage to a body of the first transistor.

21 Claims, 3 Drawing Sheets

VOLTAGE TRANSLATION CIRCUIT

BACKGROUND OF THE INVENTION

1. Field of the Invention

This invention relates in general to voltage translation circuits.

2. Description of the Related Art

Voltage translations circuits are used to translate the voltage of a signal from one analog voltage range to another analog voltage range. For example, a voltage translation circuit may be used in a phase lock loop to translate a first voltage reference signal generated in first voltage domain to a second analog reference voltage in a second voltage domain that is used to control a voltage controlled oscillator located in a second voltage domain.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a translation circuit includes a current path to provide current to a circuit node of the input stage of the translation circuit. In one embodiment, the current path is parallel to an input transistor of the input stage. The current path includes a transistor having a body biased by a circuit that provides a variable bias voltage. The current path provides current to the circuit node when the input analog signal is outside a range that places the input transistor in a conductive state. The bias circuit reduces the body bias voltage when the voltage of the input signal is in a range to place the input transistor in a conductive state to reduce the effect of the current path on the translation function of the translation circuit at those input signal voltages. With some embodiments, the current path increases the effective translation range of the translation circuit.

Figure 1:
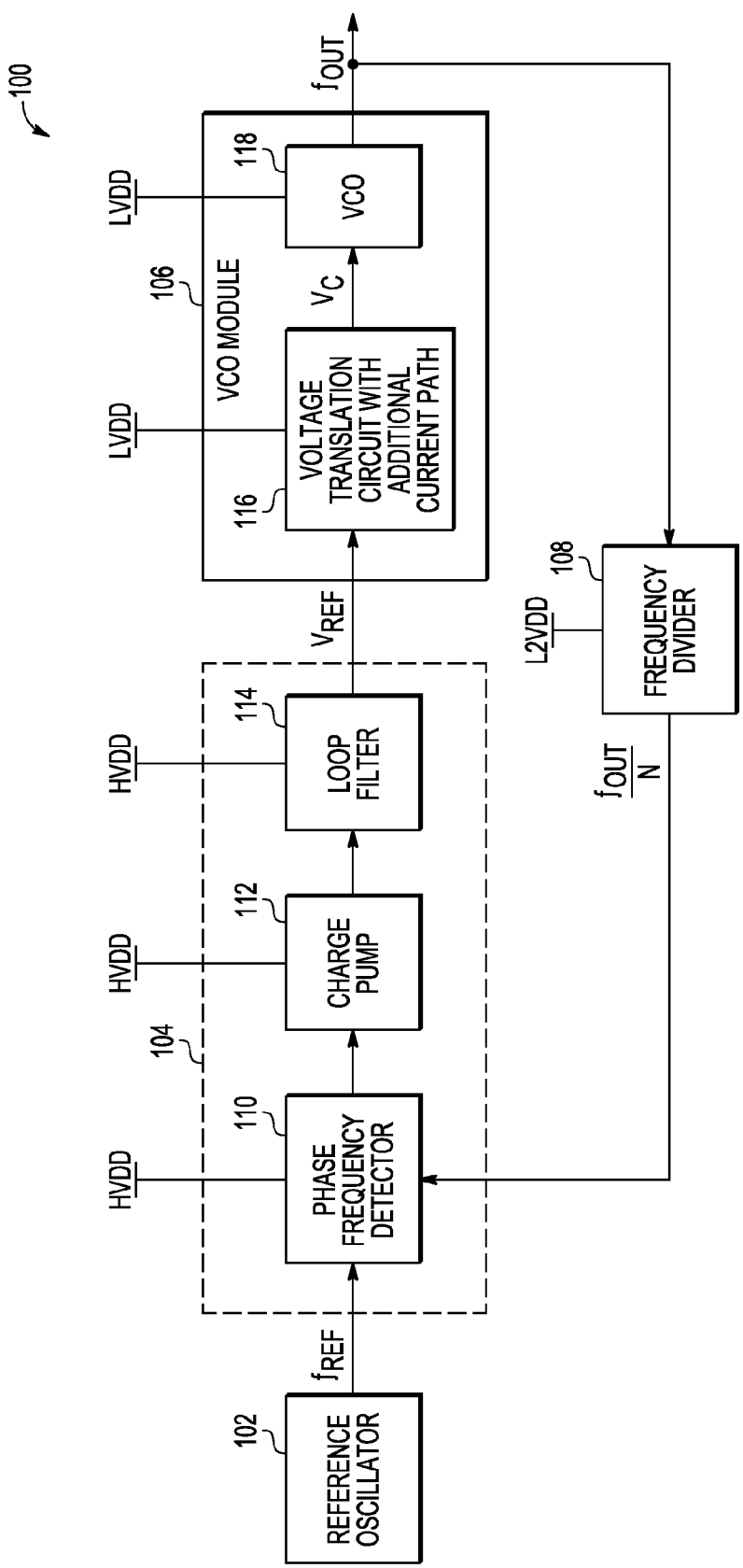
FIG. 1 is a circuit diagram of a phase lock loop according to one embodiment of the present invention.

FIG. 1 is a block diagram of a phase lock loop 100 according to one embodiment of the present invention. Phase locked loop (PLL) 100 includes a reference oscillator 102, a forward signal path 104, a voltage-controlled oscillator (VCO) module 106, and a frequency divider 108. PLL 100 produces a signal having a desired oscillation frequency (fOUT), as described in greater detail below. PLL may be used in electrical systems, e.g. such as data processing system, to provide a clock signal at a controlled frequency. It should be understood that FIG. 1 is a simplified representation of a PLL 100 for purposes of explanation, and that practical embodiments may include other devices and components to provide additional functions and features. Also, PLL 100 may have other configurations in other embodiments.

In the embodiment shown, reference oscillator 102 is coupled to the forward signal path 104, which in turn is coupled to the VCO module 106. In one embodiment, reference oscillator 102 includes an oscillator, such as, for example, a crystal oscillator, which is configured to generate a reference signal having a fixed reference frequency (fREF). The forward signal path 104 compares the reference signal generated by the reference oscillator 102 and a feedback signal from the frequency divider 108 and generates a reference voltage signal (Vref) for the VCO module 106 based on the difference between the reference frequency (fREF) and the feedback frequency (fOUT/N). As described in greater detail below, the VCO module 106 generates the output signal having a particular oscillation frequency (fOUT) that is proportionally related to the reference voltage signal (Vref). The frequency divider 108 is coupled between the output of the VCO module 106 and the forward signal path 104, and the frequency divider 108 is configured to generate or otherwise provide the feedback signal at a frequency that is equal to a factor of the oscillation frequency of the oscillating signal from the VCO module 106 (e.g., fOUT/N).

In one embodiment, the forward signal path 104 includes a phase frequency detector (PFD) 110, a charge pump 112, and a loop filter 114. The output of the PFD 110 is coupled to the input of the charge pump 112, and the output of the charge pump 112 is coupled to the input of the loop filter 114. The PFD 110 compares the reference signal and the feedback signal and generates an error signal based on the difference between the frequencies and/or phases of the feedback signal and the reference signal. In accordance with one embodiment, the error signal from the PFD 110 is an 'up' or 'down' pulse that produces an increase or decrease in the voltage output of the charge pump 112 that is proportional to the duration of the pulse. In one embodiment, the output of the charge pump 112 has a fixed voltage range, for example, from the ground voltage to another reference voltage (e.g., supply voltage HVDD). For example, in some low power applications, the voltage output of the charge pump 112 may range from 0 Volts to about 1.5 Volts. In one embodiment, the loop filter 114 includes an analog filter that provides a dominant pole for the PLL 100, thereby ensuring stability for the PLL 100. The loop filter 114 filters the voltage output from the charge pump 112, resulting in the reference voltage signal (Vref). In this manner, forward signal path 104 generates a reference voltage signal (Vref) which varies based on differences (e.g., in frequency and/or phase) between the reference signal and the feedback signal until the feedback signal is in phase-lock with or otherwise matches the reference signal (e.g., fOUT=N×fREF).

In one embodiment, the VCO module 106 includes a voltage translation circuit 116 and a voltage-controlled oscillator (VCO) 118. The voltage translation circuit 116 performs voltage level translation to generate or otherwise produce a voltage control signal (VC) for the VCO 118 based on the reference voltage signal (Vref). The VCO 118 comprises an electronic oscillator suitably configured to generate the output signal with an oscillation frequency (fOUT) that is proportional to the voltage control signal. In one embodiment, the VCO 118 is realized as a ring oscillator or another suitably configured delay oscillator that includes an odd number of delay cells. Each delay cell includes one or more transistors and/or other semiconductor devices.

In one embodiment, the voltage translation circuit 116 is designed for a particular translation ratio of the VC signal to Vref signal such that VCO 118 achieves a desired range of oscillation frequencies (fOUT) over the corresponding reference voltage signal (Vref) range. For example, in accordance with one embodiment, to achieve a desired oscillation frequency range of about 2 GHz to about 4 GHz over a Vref signal range from about 0.3-1.2 volts, the voltage translation circuit 116 may be designed to generate the voltage control signal ranging from about 0.2-0.8 Volts based on the operating characteristics of the VCO 118.

In the embodiment shown, frequency detector 110, charge pump 112, and loop filter 114 are located in a high voltage domain (HVDD) where voltage HVDD is provided as a power supply voltage to those circuits. Translation circuit 116 and VCO 118 are located in a low voltage domain where voltage LVDD is supplied as a supply voltage. In one embodiment, LVDD is 1.0 V and HVDD is 1.5 V, but either may be of other voltages in other embodiments.

In one embodiment, charge pump 112 is implemented in a higher voltage domain (HVDD) as opposed to a lower voltage domain (LVDD) to provide a wider operating range for the charge pump. Also, using a higher supply voltage allows the charge pump to be more precisely controlled and utilize less current. In one embodiment, locating the VCO 118 in a lower voltage domain as opposed to a higher voltage domain may allow for the VCO 118 to achieve a higher maximum frequency by using thin oxide transistors without reliability concerns. Thus, in the embodiment shown, the voltage control signal VC is provided at the lower voltage domain LVDD. Accordingly, translation circuit 116 translates the Vref signal at the high voltage domain to provide the VC signal in the lower voltage domain to be used by VCO 118.

Figure 2:
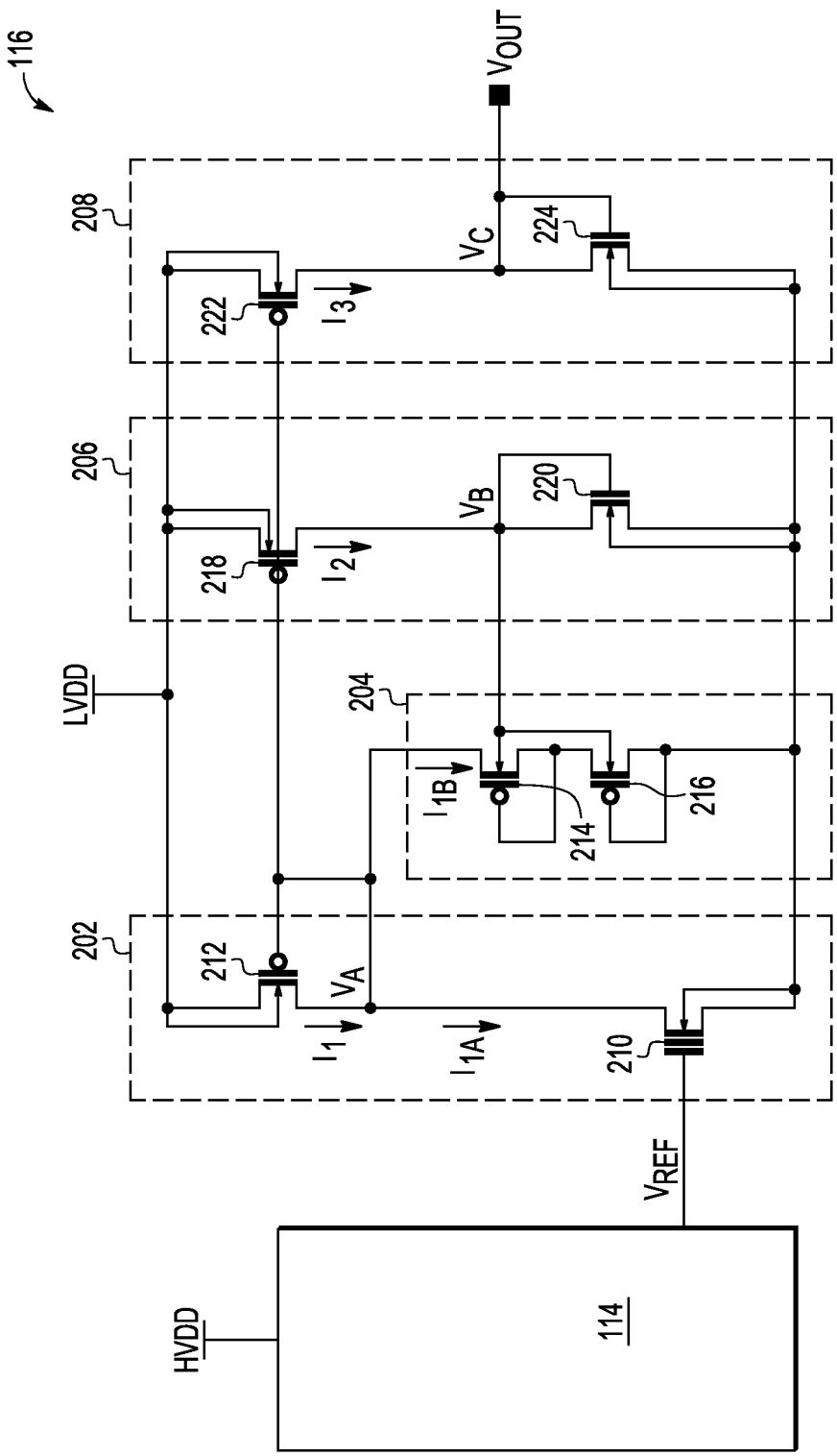
FIG. 2 is a circuit diagram of a voltage translation circuit according to one embodiment of the present invention.

FIG. 2 is a circuit diagram of voltage translation circuit 116 according to one embodiment. In the embodiment shown, translation circuit 116 includes an input stage 202, a current path circuit 204, a bias stage 206, and an output stage 208. Input stage 202 includes a transistor stack of an input transistor 210 and transistor 212. Transistor 210 is an N channel MOSFET in the embodiment shown. The source and body of transistor 210 are connected to a ground power supply terminal and the drain is connected to circuit node VA of stage 202. The gate of transistor 210 is connected to receive the Vref signal. Transistor 212 is a P-channel transistor whose source and body are tied to a low voltage power supply terminal (LVDD) and whose drain and gate are connected to node VA.

In the embodiment shown, current path circuit 204 is connected to provide a current path between node VA and the ground terminal. Current path circuit 204 includes a bias input that is connected to node VB. In the embodiment shown, circuit 204 includes two diode configured P-channel transistors 214 and 216 connected in series between node VA and ground. The bodies of transistors 214 and 216 are biased by the VB node.

Bias stage 206 includes a P-channel transistor 218 having its source and body tied to a LVDD terminal and its drain connected to node VB. The gate of transistor 218 is connected to node VA. Stage 206 also includes an N-channel transistor having its gate and drain connected to node VB and its body and source connected to the ground terminal.

Output stage 208 includes a P-channel transistor 222 having its source and body connected to the LVDD terminal, its gate connected to node VA, and its drain connected to node Vout. Stage 208 includes an N-channel transistor 224 having its drain and gate connected to node Vout and its source and body tide to the ground terminal.

In operation, circuit 116 translates the voltage of signal Vref from a range of values to provide signal VC with a voltage proportional to the voltage of Vref but in a different range of voltage values. For example, if HVDD is 1.5 Volts and LVDD is at 1.0 volts, a voltage value for signal Vref of 0.75 V would be translated to a voltage value of 0.5 V for the VC signal.

In an ideal translation circuit, every voltage value of the voltage domain for the input signal would be translated to a proportional output voltage of the voltage domain of the output signal. However, such a linear translation function across the entire input voltage range may not be practical due to non linear transistor operating characteristics ranges and leakage current.

In the embodiment shown, current I1 represents the current flowing through transistor 212, current I1A represents the current flowing through transistor 210, and current I1B represents the current flowing through current path circuit 204. For the embodiment shown, I1=I1A+I1B. I2 represents the current flowing through stage 206, and I3 represents the current flowing through output stage 208.

In order to more fully explain the function of circuit 204 and bias stage 206, the operation of circuit 116 will first be described as though circuit 204 and stage 206 do not exist circuit 116.

Assuming that circuit 204 and stage 206 do not exist in circuit 116, when the Vref signal is at 0 Volts, the voltage of Node VA is set by the leakage current through the stack of transistors 212 and 210 (current I1). At this time, the voltage of node VA is at a value that is less than LVDD by an amount that is smaller than the threshold voltage of transistor 212. As the voltage of the Vref signal rises, the current I1 remains relatively constant because current I1 is not strong enough to cause the voltage drop across transistor 212 (the source-gate voltage for diode configured transistor 212) to be at a value greater than the threshold voltage of transistor 212. Accordingly, for the range of voltages of Vref between 0 volts and the threshold voltage of transistor 210, the voltage of Node VA (and correspondingly, the voltage of node Vout) does not change with a rise in voltage of Vref (assuming that circuit 204 does not exist).

Once the voltage of Vref rises above the threshold voltage of transistor 210, the amount of current I1 increases due to transistor 210 being in a conductive state. Once current I1 increase past a particular current threshold (which is dependent upon the characteristics of transistor 212), the increase in current I1 past this threshold causes the voltage drop across transistor 212 to increase to sustain current I1. This increase in the voltage drop causes the voltage of node VA to drop proportional to the rise in current of I1. At this point, the current I1 is at a level that its increase causes a proportional increase in the voltage drop across transistor 212 due to the increase in the source gate voltage of transistor 212 to sustain the increase in current I1. Because stage 208 is configured as a current mirror of stage 202, the increase in current I1 causes a proportional decrease in voltage VA and therefore causes a proportional increase in current I3 in stage 208. As current I3 rises, the voltage of Vout increases due the voltage drop across the diode connected transistor 224. Consequently, for Vref being at voltages above the threshold voltage of transistor 210, the voltage Vout is proportional within the low voltage domain to the voltage of Vref in the high voltage domain.

In one embodiment, the proportionality of Vref to Vout holds true until current I1 reaches a value where it no longer increases with a rise in the voltage of Vref. This point is based on the characteristics of transistor 210. Accordingly, for proper operation in some embodiments, a PLL using translation circuit 116 (without current path circuit 204) should be designed so that Vref operates in a voltage range between the threshold voltage of input transistor 210 and the point where current I1 no longer increases with the increase in the voltage of Vref.

Because the Vref signal is produced from a higher voltage domain (HVDD) circuit than the voltage domain (LVDD) of translation circuit 116, transistor 210 has a thicker gate dielectric than the other transistors of circuit 116 in order handle the higher domain voltage. However, providing transistor 210 with thicker gate dielectric increases the threshold voltage of transistor 210. As described above, the bottom value of the range of voltages for which the voltage of Vout is proportional to Vref (the effective translation range) for circuit 116 without current path circuit 204 is governed by the threshold voltage of transistor 210. Accordingly, an increase in the threshold voltage of transistor 210 reduces the effective translation range of circuit 116.

In order to increase the effective translation range of circuit 116, circuit 116 includes current path circuit 204 in parallel with the input transistor 210 to provide for an increase in current I1 at voltage levels of Vref below the threshold voltage of transistor 210. As stated above, current I1 is the sum of the current I1B flowing through current path circuit 204 and the current IA1 flowing through transistor 210 (I1=I1A+I1B). The additional current from current path circuit 204 places transistor 212 in an operating range where the voltage across transistor 212 (the source-gate voltage) increases proportional to I1 when the current IA1 is small or minimal due to the voltage of Vref being below the extra higher threshold voltage of input transistor 210. By providing current I1B, transistor 212 operates in a mode where the source-gate voltage of transistor 212 increases with an increase in I1 at smaller values of I1A. Consequently, the effective translation range of circuit 116 is increased.

In the embodiment shown, current path circuit 204 includes two diode connected transistors 214 and 216 configured to provide a desirable amount of current IB1 to make the gate source voltage of transistor 212 change proportional to current I1 in a range where little current is flowing through transistor 210 (current I1A) due to the higher threshold voltage of transistor 210. In one embodiment, the current provided by current path circuit 204 is few micro Amps when Vref is at 0V. The amount of current provided by current path circuit 204 can be changed by changing the number and/or size of the transistors in current path circuit 204. For example, the current may be increased by including only one transistor in current path circuit 204 or by making the transistors wider to decrease the resistance of the path. The resistance of path circuit 204 may also be decreased by circuit 204 including diode connected transistors in an additional branch in parallel to transistor 214 and 216 between node VA and ground.

The amount of current of current path circuit 204 can also be changed by changing the body bias voltage of the transistors of current path circuit 204. Increasing the bias voltage increases the threshold voltage of the transistors and thereby decreases the amount of current through current path circuit 204. In an alternative embodiment, only one of the transistors of path circuit 204 is biased at node VB with the other transistor of the path being biased at another voltage (e.g. ground).

Circuit 116 includes a variable bias stage 206 that provides a bias voltage to the transistors 214 and 216 of current path circuit 204 that changes over the translation range of circuit 116. In the embodiment shown, stage 206 is implemented as a current mirror with stage 202 (like the output stage 208). With such an embodiment, stage 206 provides a bias voltage at node VB that is proportional to the voltage at node Vout.

In some embodiments, stage 206 is omitted and the bodies of transistors 214 and 216 are tied to Vout where output stage 208 also serves as a bias circuit. However, in some embodiments, providing the bias voltage with an additional bias stage 206 reduces the output load on stage 208.

As the current I1 increases due to an increase the voltage of Vref, the voltage of node VA decreases to increase current I2 though stage 206. As current I2 increases, the voltage of VB increases due the increased voltage drop across the diode connected transistor 220 of stage 206.

Because the voltage of VB rises with an increase in the voltage of Vref, the current I1B provided from current path circuit 204 decreases with an increase in the voltage of Vref in that the body voltages of transistors 214 and 216 increase with a rise in the voltage of VB. Once Vref rises above the voltage threshold of transistor 210, it may desirable that the current I1 flowing through transistor 212 be produced entirely from Vref (current IA1) and not from current path circuit 204 (current IB1) in order to provide better proportionality between Vref and Vout. Since the current IB1 through current path circuit 204 is not needed at higher voltages of Vref, increasing the body bias voltage VB advantageously reduces current IB1 at these higher voltages of Vref.

Figure 3:
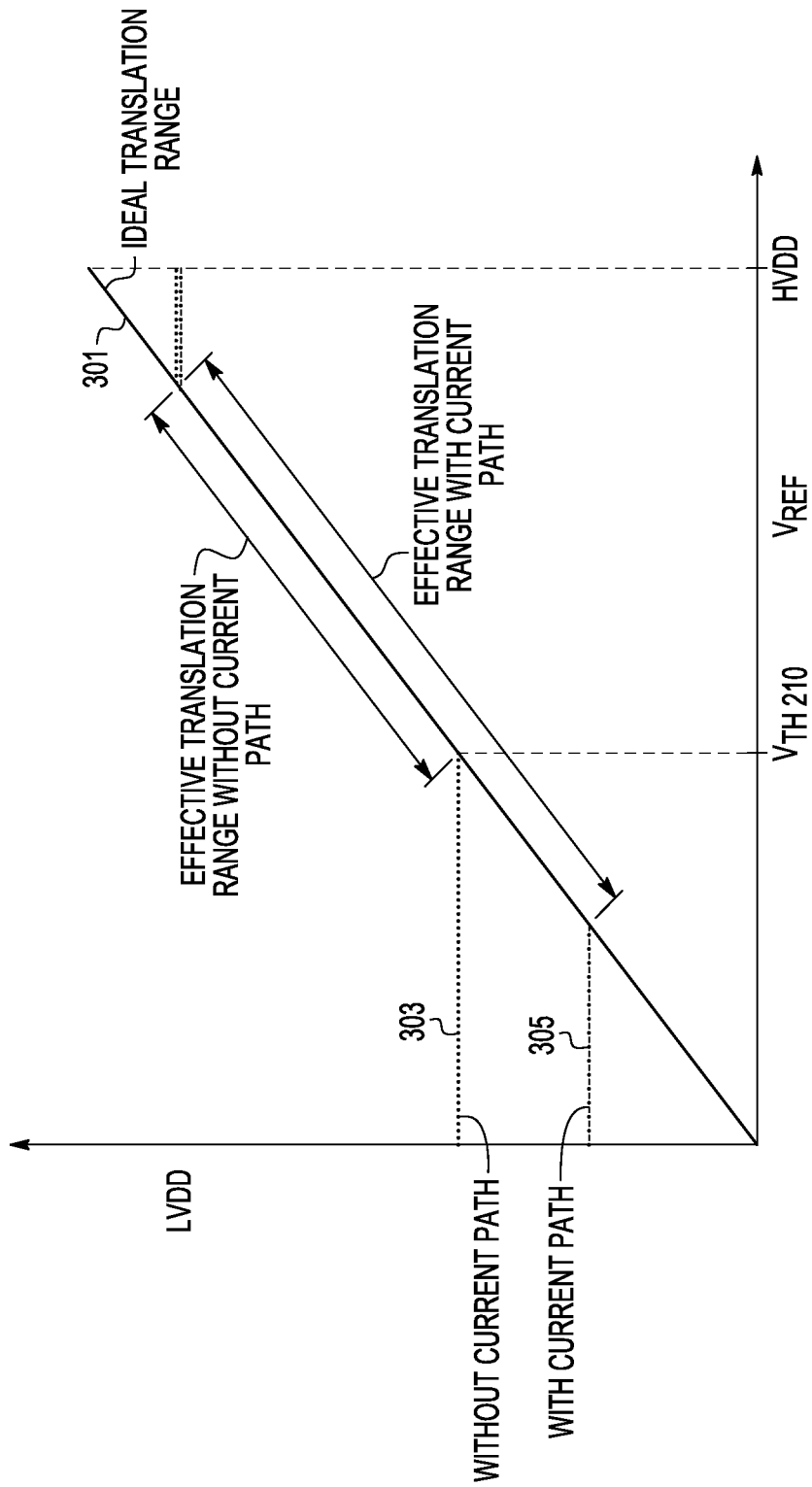
FIG. 3 is a graph illustrating the effect of an additional current path on a translation function of a translation circuit according to one embodiment of the present invention.

FIG. 3 is a graph showing the increased effective translation range due to the current path circuit 204 as opposed to the effective translation range of a translation circuit without an additional current path. In FIG. 3, line 301 is an ideal translation function for a voltage translation circuit between an input signal (Vref) in the higher voltage domain HVDD (the X axis) and an output signal (VC) in the lower voltage domain LVDD (the Y axis). As shown in FIG. 1, the ideal translation range extends from Vref=0 to Vref=HVDD.

For a translation circuit without a current path circuit 204, the translation function is shown as line 303. As shown in FIG. 3, the translation function of line 303 for voltages of Vref below the threshold voltage (VTH210) of transistor 210 is non proportional to the voltage of VC. As explained earlier, this is due to the negligible leakage current I1 when transistor 210 is non conducting. Because the translation function of line 303 is not proportional for voltages of Vref less than the threshold voltage of transistor 210 (VTH210), such a translation circuit cannot be effective for voltages of Vref below the threshold voltage of the input transistor.

Line 305 represents a translation function for a translation circuit with an additional current path circuit 204. As stated above, the current IB1 from current path circuit 204 makes I1 higher for voltages of Vref below the threshold voltage of transistor 210. Accordingly, transistor 212 will operate in a mode at lower levels of current IA1 where such that the drop across transistor 212 (the gate-source voltage) increases with increases in current IA1. Accordingly, the voltage of VC is proportional to the voltage of Vref at lower voltage levels of Vref, thereby increasing the effective translation range of the translation circuit.

Although circuit 116 includes an input transistor 210 with a with a thicker gate dielectric than the other transistors of circuit 116, a current path (204) with a variable body bias voltage can be used in a circuit where the input transistor has the same dielectric thickness as the other transistors of the translation circuit.

In addition, the conductivity of the transistors of the translation circuit may be switched where the input transistor is a P channel transistor and the current mirror current is controlled with N-channel transistors (similar to transistors 212, 218, and 222 but with the sources connected a ground power supply terminal instead). With such a circuit, the current path circuit (204) would be connected between the LVDD terminal and node VA and may include diode connected N-channel transistors.

While translation circuit has been shown implemented in a phase lock loop, a translation circuit that includes a current path circuit for the input stage may be used in other types of systems wherein an analog signal is translated from a higher voltage domain to a lower voltage domain. For example, such a circuit may be used in a sensor were the sensor actuator operates in a higher voltage domain than the sensor control circuitry.

In one embodiment, a voltage translation circuit includes an input stage including a circuit node and an input transistor coupled between the circuit node and a power supply terminal. A control electrode of the input transistor is coupled to receive an input analog voltage signal. The voltage translation circuit includes an output node for providing an output analog voltage signal having a voltage that is a translated voltage of a voltage of the input analog voltage signal over a range of voltages of the input analog voltage signal. The voltage translation circuit includes a current path in parallel with the input transistor. The current path comprises a first transistor coupled between the circuit node and the power supply terminal. The voltage translation circuit includes a circuit coupled to provide a variable body bias voltage to a body of the first transistor.

In another embodiment, a voltage translation circuit includes a first transistor having a first current electrode coupled to a first power supply terminal, a second current electrode coupled to a first circuit node, and a control electrode coupled to the first circuit node. The voltage translation circuit includes a second transistor having a first current electrode coupled to the first circuit node, a second current electrode coupled to a second power supply terminal, and a control electrode coupled to receive an input analog voltage signal. The voltage translation circuit includes a third transistor having a first current electrode coupled to the first circuit node, a second current electrode coupled to the second power supply terminal, and a control electrode coupled to the second current electrode of the third transistor. The voltage translation circuit includes a first circuit coupled to provide a variable bias voltage to a body of the third transistor and an output node which provides an output analog voltage signal having a voltage that is a translated voltage of a voltage of the input analog voltage signal over a range of values of the input analog voltage signal.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A voltage translation circuit comprising:
   an input stage including a circuit node and an input transistor coupled between the circuit node and a power supply terminal, wherein a control electrode of the input transistor is coupled to receive an input analog voltage signal;
   an output node for providing an output analog voltage signal having a voltage that is a translated voltage of a voltage of the input analog voltage signal over a range of voltages of the input analog voltage signal;
   a current path in parallel with the input transistor, wherein the current path comprises a first transistor coupled between the circuit node and the power supply terminal;
   a circuit coupled to provide a variable body bias voltage to a body of the first transistor;
   wherein the circuit comprises a current mirror which mirrors a current of the input stage to produce the variable body bias voltage.

2. The voltage translation circuit of claim 1, wherein the variable body bias voltage is proportional to the voltage of the output analog voltage signal.

3. A voltage translation circuit comprising:
   an input stage including a circuit node and an input transistor coupled between the circuit node and a power supply terminal, wherein a control electrode of the input transistor is coupled to receive an input analog voltage signal;
   an output node for providing an output analog voltage signal having a voltage that is a translated voltage of a voltage of the input analog voltage signal over a range of voltages of the input analog voltage signal;
   a current path in parallel with the input transistor, wherein the current path comprises a first transistor coupled between the circuit node and the power supply terminal;
   a circuit coupled to provide a variable body bias voltage to a body of the first transistor;
   wherein the input transistor has a threshold voltage;
   wherein for voltages of the control electrode of the input transistor in a first voltage range on one side of the threshold voltage, the input transistor is characterized as being non conductive;
   wherein for voltages of the control electrode of the input transistor in a second voltage range on an other side of the threshold voltage, the input transistor is characterized as being conductive;
   wherein the current path is configured to produce a current when the voltage of the control electrode is in the first voltage range, that is greater than a current produce by the current path when the voltage of the control electrode is at a voltage in a portion of the second voltage range.

4. The voltage translation circuit of claim 1, wherein a gate dielectric of the input transistor is thicker than a gate dielectric of the first transistor of the current path and a transistor of the circuit.

5. The voltage translation circuit of claim 1, wherein an effective resistance of the current path varies responsive to the variable body bias voltage.

6. The voltage translation circuit of claim 1 wherein the input stage further comprises:
   a second transistor having a first current electrode coupled to a second power supply terminal, a second current electrode coupled to the circuit node, and a control electrode coupled to the circuit node, wherein the second transistor is of an opposite conductivity type to the first transistor.

7. The voltage translation circuit of claim 1 wherein the circuit is configured to provide the variable body bias voltage to have a voltage that changes over at least a portion of the range of voltages of the input analog voltage signal.

8. A voltage translation circuit comprising:
   an input stage including a circuit node and an input transistor coupled between the circuit node and a power supply terminal, wherein a control electrode of the input transistor is coupled to receive an input analog voltage signal;
   an output node for providing an output analog voltage signal having a voltage that is a translated voltage of a voltage of the input analog voltage signal over a range of voltages of the input analog voltage signal;
a current path in parallel with the input transistor, wherein the current path comprises a first transistor coupled between the circuit node and the power supply terminal;
a circuit coupled to provide a variable body bias voltage to a body of the first transistor;
wherein the variable body bias voltage is the voltage of the output analog voltage signal.

9. A voltage translation circuit comprising:
an input stage including a circuit node and an input transistor coupled between the circuit node and a power supply terminal, wherein a control electrode of the input transistor is coupled to receive an input analog voltage signal;
an output node for providing an output analog voltage signal having a voltage that is a translated voltage of a voltage of the input analog voltage signal over a range of voltages of the input analog voltage signal;
a current path in parallel with the input transistor, wherein the current path comprises a first transistor coupled between the circuit node and the power supply terminal;
a circuit coupled to provide a variable body bias voltage to a body of the first transistor;
wherein the first transistor is diode connected.

10. The voltage translation circuit of claim 9, wherein the current path comprises a second transistor which is diode connected and coupled in series with the first transistor between the first transistor and the power supply terminal, wherein the circuit is coupled to provide the variable body bias voltage to a body of the second transistor.

11. A voltage translation circuit comprising:
an input stage including a circuit node and an input transistor coupled between the circuit node and a power supply terminal, wherein a control electrode of the input transistor is coupled to receive an input analog voltage signal;
an output node for providing an output analog voltage signal having a voltage that is a translated voltage of a voltage of the input analog voltage signal over a range of voltages of the input analog voltage signal;
a current path in parallel with the input transistor, wherein the current path comprises a first transistor coupled between the circuit node and the power supply terminal;
a circuit coupled to provide a variable body bias voltage to a body of the first transistor;
an output stage coupled in parallel with the circuit, wherein the output stage comprises the output node and a current mirror which mirrors a current of the input stage to provide the output analog voltage signal at the output node.

12. A voltage translation circuit comprising:
an input stage including a circuit node and an input transistor coupled between the circuit node and a power supply terminal, wherein a control electrode of the input transistor is coupled to receive an input analog voltage signal;
an output node for providing an output analog voltage signal having a voltage that is a translated voltage of a voltage of the input analog voltage signal over a range of voltages of the input analog voltage signal;
a current path in parallel with the input transistor, wherein the current path comprises a first transistor coupled between the circuit node and the power supply terminal;
a circuit coupled to provide a variable body bias voltage to a body of the first transistor;
wherein the circuit includes the output node and the output node is connected to the body of the first transistor.

13. A phase lock loop comprising:
a voltage translation circuit comprising:
an input stage including a circuit node and an input transistor coupled between the circuit node and a power supply terminal, wherein a control electrode of the input transistor is coupled to receive an input analog voltage signal;
an output node for providing an output analog voltage signal having a voltage that is a translated voltage of a voltage of the input analog voltage signal over a range of voltages of the input analog voltage signal;
a current path in parallel with the input transistor, wherein the current path comprises a first transistor coupled between the circuit node and the power supply terminal;
a circuit coupled to provide a variable body bias voltage to a body of the first transistor;
a forward signal path including a first input to receive an oscillator signal and including an output coupled to the control electrode to provide the input analog voltage signal;
a voltage controlled oscillator circuit including an input coupled to the output node to receive the output analog voltage signal and including an output to provide a signal having a frequency that is controlled by the output analog voltage signal;
a feedback circuit coupled between the output of the voltage controlled oscillator circuit and a second input of the forward signal path.

14. The voltage translation circuit of claim 3, wherein the circuit comprises a current mirror which mirrors a current of the input stage to produce the variable body bias voltage.

15. A voltage translation circuit, comprising:
a first transistor having a first current electrode coupled to a first power supply terminal, a second current electrode coupled to a first circuit node, and a control electrode coupled to the first circuit node;
a second transistor having a first current electrode coupled to the first circuit node, a second current electrode coupled to a second power supply terminal, and a control electrode coupled to receive an input analog voltage signal;
a third transistor having a first current electrode coupled to the first circuit node, a second current electrode coupled to the second power supply terminal, and a control electrode coupled to the second current electrode of the third transistor;
a first circuit coupled to provide a variable bias voltage to a body of the third transistor; and
an output node which provides an output analog voltage signal having a voltage that is a translated voltage of a voltage of the input analog voltage signal over a range of values of the input analog voltage signal.

16. The voltage translation circuit of claim 15, further comprising:
a fourth transistor coupled in series between the third transistor and the second power supply terminal, the fourth transistor having a first current electrode coupled to the second current electrode of the third transistor, a second current electrode coupled to the second power supply terminal, and a control electrode coupled to the second current electrode of the fourth transistor, wherein the body bias circuit is coupled to provide the variable bias voltage to a body of the fourth transistor, wherein the second current electrode of the third transistor is coupled to the second power supply terminal via the fourth transistor.

17. The voltage translation circuit of claim 15, wherein the first circuit further comprises:
- a fifth transistor having a first current electrode coupled to the first power supply terminal, a second current electrode coupled to a second circuit node, and a control electrode coupled to the first circuit node; and
- a sixth transistor having a first current electrode coupled to the second circuit node, a second current electrode coupled to the second power supply terminal, and a control electrode coupled to the second circuit node, wherein the second circuit node provides the variable bias voltage to the body of the third transistor.

18. The voltage translation circuit of claim 17, wherein the second circuit node is the output node.

19. The voltage translation circuit of claim 17, further comprising:
- a seventh transistor having a first current electrode coupled to the first power supply terminal, a second current electrode coupled to the output node, and a control electrode coupled to the first circuit node; and
- an eighth transistor having a first current electrode coupled to the output node, a second current electrode coupled to the second power supply terminal, and a control electrode coupled to the output node.

20. The voltage translation circuit of claim 15, wherein a gate dielectric of the second transistor is thicker than a gate dielectric of each of the first and third transistors.

21. The voltage translation circuit of claim 15, wherein a body of the first transistor is coupled to the first power supply terminal and a body of the second transistor is coupled to the second power supply terminal.

\* \* \* \* \*